United States Patent [19]

Matsubara

[11] Patent Number: 5,694,611

[45] Date of Patent: Dec. 2, 1997

[54] MICROCOMPUTER INCLUDING INTERNAL AND DIRECT EXTERNAL CONTROL OF EEPROM AND METHOD OF MAKING THE MICROCOMPUTER

[75] Inventor: Toshiyuki Matsubara, Itami, Japan

[73] Assignees: Mitsubishi Denki Kabushiki Kaisha, Tokyo; Mitsubishi Electric Semiconductor Software Co., Ltd., Hyogo, both of Japan

[21] Appl. No.: 515,332

[22] Filed: Aug. 15, 1995

[30] Foreign Application Priority Data

Aug. 22, 1994 [JP] Japan .................. 6-196626

[51] Int. Cl.$^6$ .................. G06F 15/78
[52] U.S. Cl. .................. 395/800; 365/195; 365/185.04; 364/DIG. 1
[58] Field of Search .................. 395/800; 364/DIG. 1; 365/195, 218, 228, 185.04

[56] References Cited

U.S. PATENT DOCUMENTS

| | | | |
|---|---|---|---|
| 4,718,037 | 1/1988 | Thaden | 395/900 |
| 4,807,114 | 2/1989 | Itoh | 264/200 |
| 5,175,840 | 12/1992 | Sawase et al. | 395/425 |
| 5,428,808 | 6/1995 | Sawase et al. | 375/800 |
| 5,574,926 | 11/1996 | Miyazawa et al. | 395/800 |

FOREIGN PATENT DOCUMENTS 5165980  2/1993  Japan .

OTHER PUBLICATIONS

Japanese Electronics Journal, "Nikkei Electronics", No. 404, Sep. 22, 1986.

Primary Examiner—Alyssa H. Bowler
Assistant Examiner—Dzung C. Nguyen
Attorney, Agent, or Firm—Leydig, Voit & Mayer, Ltd.

[57] ABSTRACT

A microcomputer including an EEPROM in which data may be stored and from which stored data may be read either under control of a central processing unit of the microcomputer or under direct external control. The microcomputer includes separate inputs for data input and data output signals when storing and reading is under the control of the central processing unit and when storing and reading of data is under direct external control. The central processing unit may inhibit direct external control of storing data in and reading data from the EEPROM.

9 Claims, 9 Drawing Sheets

MICROCOMPUTER INCLUDING INTERNAL AND DIRECT EXTERNAL CONTROL OF EEPROM AND METHOD OF MAKING THE MICROCOMPUTER

BACKGROUND OF THE INVENTION

1. Field of the Invention

The present invention relates to a microcomputer and a manufacturing method thereof and, more particularly, to a microcomputer with a built-in EEPROM and a manufacturing method thereof.

2. Description of the Related Art

FIG. 10 is a block diagram showing an arrangement of a known microcomputer with a built-in EEPROM, for example, which can be mounted in an IC card or others. As shown in FIG. 10, included in a microcomputer 1 are a CPU 2 for data processing, a ROM 3 for storing a processing program for the processing of the CPU 2, a RAM 4 for temporarily storing data, an EEPROM 5 for always storing data and for rewriting the data if required, an input/output circuit 6 for controlling the input and output of data from and to the external, and a system bus 7 electrically coupled to these functions. Further, provided in an IC card-only microcomputer 1 are five terminals used as input/output terminals according to the standard of ISO (International Organization for Standardization): a VDD terminal P1, GND terminal P2, RST (reset) terminal P3, CLK (clock) terminal P4, and I/O terminal P5.

In operation, the microcomputer 1 starts to operate in response to input of signals from the external through the VDD terminal P1, GND terminal P2, RST terminal P3, and CLK terminal P4. In addition, the microcomputer 1 serially performs the giving and receiving of data to and from the external through the I/O terminal P5, and the input/output circuit 6 carries out the serial-to-parallel conversion to convert data from serial into parallel form which in turn is transferred through the system bus 7 to the CPU 2. The CPU 2 processes the transferred data in accordance with the processing program stored in the ROM 3. The data to be temporarily stored is placed in the RAM 4 and the data to be permanently stored is placed in the EEPROM 5. Further, the data such as the processing results to be output to the external is subjected to the parallel-to-serial conversion in the input/output circuit 6 to be converted into the serial data, before being output through the I/O terminal P5 to the external.

As described above, the EEPROM 5 built in the known microcomputer is subjected to the writing/reading control by the CPU 2. In addition, since the known microcomputer 1 with a built-in EEPROM is made to carry out the input/output of the data serially from and to the external, the writing of the data in the EEPROM 5 requires much time. In particular, there is a problem which arises with carrying out the writing many times (for example, approximately 10000 times) in the testing stage, in that the writing test requires massive time. Moreover, in cases where the initial data are written in the entire area of the EEPROM 5 before the EEPROM 5 is put on the market, the writing of data in serial form required huge amounts of time.

Recently, the EEPROM 5, serving as a non-volatile memory, has attracted special interest because of accomplishing the hold of the stored data without using power back-up (not losing the data even if the power supply turns off) and making the data electrically rewritable. Although the idea of such an EEPROM 5 has been contemplated for a long time, the manufacturing method thereof has not been perfected. Recently, progress in the manufacturing technique has finally allowed the EEPROM 5 to be incorporated in a microcomputer 1. However, it is still difficult to form the microcomputer 1 and the EEPROM 5 on the same chip, and particularly, difficulty is experienced in normal operation of both the CPU 2 and EEPROM 5 by one evaluation test from the first after the manufacturing in the case of mounting a larger-capacity EEPROM or in the case of manufacturing it in a finer process. Further, for the EEPROM 5 being operated by only the control of the CPU 2, the evaluation of the EEPROM 5 is impossible until the peripheral devices other than the EEPROM 5 come into certain operation.

Accordingly, as means to resolve these problems, a microcomputer with a built-in EEPROM has been developed as exemplified by the Japanese Patent Laid-Open No. 5-165980 wherein the EEPROM data is writable and readable directly from the external as illustrated in FIG. 11. In FIG. 11, a control section 119 is electrically connected to an EEPROM 118 and further is connected to two terminals, an SCL terminal 111 and an SDA terminal 112. In the control section 119, there are provided a control circuit 113 connected to the SCL terminal 111 and a voltage generating circuit 115 connected to the control circuit 113 and made to generate a high voltage for writing operation. In addition, included therein are an address counter 114, data register 116, and data outputting circuit 117, which are electrically coupled to the SDA terminal 112. To the SDA terminal 112 there is also connected the control circuit 113, and to the control circuit 113 and data outputting circuit 117 there is connected the data register 116, and to the address counter 114 and data register 116 there are connected the EEPROM 118.

A description will be made hereinbelow in terms of the operation. In the case of writing of data in the EEPROM 118, address data indicative of an address of the EEPROM 118 in which data is to be written is inputted from the SCL terminal 111 through the control circuit 113 to the address counter 114 and transferred to the EEPROM 118, and a writing signal declaring the execution of the writing is inputted in the SDA terminal 112. Moreover, the data to be written is input from the SDA terminal 112 to the data register 116, and when having made 8 bits complete in the data register 116, the data is delivered to the address indicated by the address data inputted in the address counter 114 wherein the writing operation is carried out through a high voltage generated by the writing voltage generating circuit 115. On the other hand, in the case of reading of the data, address data representative of an address of the EEPROM 118 from which the data is to be read out is input from the SCL terminal 111 through the control circuit 113 to the address counter 114, and a reading signal declaring the execution of the read-out is input in the SDA terminal 112. The data transferred from the EEPROM 118 to the data register 116 is let through the outputting circuit 117 to the SDA terminal 112 for the reading-out.

The above-mentioned arrangement has advantages in that the writing/reading of the data to and from the EEPROM 118 can be achieved without passing through the CPU 2 (see FIG. 10). However, in general an IC card or the like equipped with the microcomputer containing the EEPROM is used as a bank card, credit card or others and important data such as financial data and business data is stored in the EEPROM 118, while a problem arises in security of data for that, in the EEPROM built-in microcomputer to be used for the IC card or the like, the data of the EEPROM is writable and readable directly from the external.

Furthermore, generally included in the EEPROM built-in microcomputer is an operation register which is provided to change the operation mode for realizing various functions of the EEPROM. For example, a status register being one of the operation registers sets a determined value therein, thereby changing the writing mode to the EEPROM. Since the operation register is commonly contained in the RAM 4 or an auxiliary area of the EEPROM and the contents of the operation register are set only under the control of the CPU 2, if the CPU 2 does not operate positively, there results a difficulty being encountered to set the contents of the operation register and the evaluation contents become unsatisfied because of no change of the operation mode in the evaluation test of the EEPROM 5.

SUMMARY OF THE INVENTION

The present invention has been developed in order to eliminate the forgoing problems, and it is therefore an object of this invention to provide a microcomputer and a manufacturing method thereof which are capable of the direct writing/reading control of parallel data of the EEPROM from the external, the selection between allowance and inhibition of the control from the external, and sharply reducing the test time for the EEPROM needed when being put on the market as well as improving the security of data.

Another object is to provide a microcomputer and manufacturing method thereof which are capable of directly controlling from the external the operation register for change of the operation mode in the test of the EEPROM taken when being put on the market so that the test offers full evaluation contents.

A microcomputer according to the first aspect of this invention is provided with central processing means, an EEPROM serving as a non-volatile memory allowing data to be electrically writable and readable, first input and output means electrically connected to the central processing means to perform input and output of a signal from and to an external so that data is written and read out in and from the EEPROM under control of the central processing means, second input and output means electrically connected to the EEPROM to perform input and output of a signal whereby the writing and reading of data in and from the EEPROM are carried out directly from the external, and signal switching control means electrically connected to between the central processing means and the first and second input and output means to selectively perform switching between the signal from the first input and output means and the signal from the second input and output means.

A microcomputer according to the second aspect has first external input and output control means electrically connected to between the signal switching control means and the second input and output means to perform switching between allowance and inhibition of the input and output from and to the external to be made by the second input and output means under control of the central processing means.

A microcomputer according to the third aspect comprises an operation register electrically connected to the central processing means and further to the second input and output means so that an operation mode of the EEPROM is set through one of the central processing means and the second input and output means.

A microcomputer according to the fifth aspect further comprises second external input and output control means electrically connected to between the signal switching control means and the operation register, and the second input and output means to perform switching between allowance and inhibition of the input and output from and to the external to be made by the second input and output means under control of the central processing means.

In a microcomputer according to the fourth and sixth aspects, wherein the EEPROM and the operation register are made on the same memory map.

A microcomputer according to the seventh and eighth aspects further comprises first and second initial setting means for allowing the external input and output control means to be set to a state where the input and output from and to the external are possible in an initial state.

A method of manufacturing a microcomputer according to the ninth aspect comprises the steps of: producing a microcomputer equipped with central processing means, an EEPROM serving as a non-volatile memory allowing data to be electrically writable and readable, first input and output means electrically connected to the central processing means to perform input and output of a signal from and to an external so that data is written and read out in and from the EEPROM through the central processing means, second input and output means electrically connected to the EEPROM to perform input and output of a signal whereby the writing and reading of data in and from the EEPROM are carried out directly from the external, and signal switching control means electrically connected to between the central processing means and the first and second input and output means to selectively perform switching between the signal from the first input and output means and the signal from the second input and output means; testing the writing and reading of data in and from the EEPROM through the first input and output means and the central processing means; directly testing the writing and reading of data in and from the EEPROM from the external through the second input and output means; writing initial data in the EEPROM; and inhibiting, by the external input and output control means, the input and output from and to the external to be made by the second input and output means.

According to the eleventh and thirteenth aspects further comprises first and second external input and output control means electrically connected to between the signal switching control means and the second input and output means to perform switching between allowance and inhibition of the input and output from and to the external to be made by the second input and output means under control of the central processing means In a method of manufacturing a microcomputer according to the tenth and twelfth aspects, the microcomputer further comprises an operation register electrically connected to the central processing means and further to the second input and output means so that an operation mode of the EEPROM is set through one of the central processing means and the second input and output means, and further comprising the step of setting an operation mode of the EEPROM in the operation register through the second input and output means.

In a method of manufacturing a microcomputer according to the fourteenth and fifteenth aspects, the EEPROM and the operation register are made on the same memory map.

According to the first aspect, there are provided the second input and output means for directly performing the writing and reading in and from the memory of the EEPROM from the external and external input and output control means for carrying out the switching between the allowance and inhibition of the input and output from and to the external to be made by the second input and output means, which makes it possible to quickly conduct processes such as continuous writing test into the EEPROM memory which has heretofore taken much time.

In addition, according to the second aspect, since the control means switches between the allowance and inhibition of the input and output from and to the external, if the switching is made beforehand such that the input and output from and to the external are inhibited when the microcomputer is put on the market, it is possible to prevent the data from being rewritten and read out on the market.

According to the third aspect, there are provided the second input and output means for directly performing the writing and reading in and from the memory of the EEPROM from the external, whereby the control of the operation register of the EEPROM is directly made from the external through the second input and output means. This allows quickly conducting processes such as continuous writing test into the EEPROM memory which has heretofore taken much time and freely setting the contents of the operation register from the external for the evaluation test of the EEPROM.

According to the fifth aspect, there are provided the second input and output means for directly performing the writing and reading in and from the memory of the EEPROM from the external and external input and output control means for carrying out the switching between the allowance and inhibition of the input and output from and to the external to be made by the second input and output means. Moreover, the control of the operation register of the EEPROM is made directly from the external through the second input and output means. This permits quickly conducting processes such as continuous writing test into the EEPROM memory which has heretofore taken much time and freely setting the contents of the operation register from the external for the evaluation test of the EEPROM. In addition, since the control means switches between the allowance and inhibition of the input and output from and to the external, if the switching is made beforehand such that the input and output are inhibited when the microcomputer is put on the market, it is possible to prevent the data from being rewritten and read out on the market.

According to the fourth and sixth aspects, the EEPROM memory and the operation register are placed on the same memory map, which can easily carry out the writing and reading of data in and from any one of the EEPROM memory and the operation register by merely setting an address of the EEPROM memory or an address of the operation register in the second input and output means.

According to the seventh and eighth aspects, the initial setting means is provided which is designed to set the external input and output control means so that the input and output are possible in the initial state, whereby the microcomputer is set into a state in which the direct control is automatically allowed from the external at the time of turning-on of a power supply.

According to the ninth aspect, in a method of manufacturing an EEPROM built-in microcomputer, the direct control of the EEPROM is made from the external, thus quickly conducting processes such as continuous writing test into the EEPROM memory which has heretofore taken much time.

In addition, according to the eleventh and thirteenth aspects, since the switching is made between the allowance and inhibition of the input and output from and to the external by the external input and output control means afterwards, if the switching is made beforehand such that the input and output to and from the external are inhibited when the microcomputer is put on the market, it is possible to prevent the data from being rewritten and read out on the market.

According to the twelfth aspect, the operation register controllable from the external is provided so that the contents of the operation register are freely changed from the external for the evaluation test of the EEPROM, which makes it possible to enrich the evaluation contents in the evaluation test.

According to the tenth aspect, in a method of manufacturing an EEPROM built-in microcomputer, the direct control of the EEPROM is made from the external, thus quickly conducting processes such as continuous writing test into the EEPROM memory which has heretofore taken much time. In addition, the operation register controllable from the external is provided so that the contents of the operation register are freely changed from the external for the evaluation test of the EEPROM, which makes it possible to enrich the evaluation contents in the evaluation test.

According to the fourteenth and fifteenth aspects, the EEPROM memory and the operation register are placed on the same memory map, which can easily carry out the writing and reading of data in and from any one of the EEPROM memory and the operation register by merely setting an address of the EEPROM memory or an address of the operation register in the second input and output means, thus allowing speedy and effective evaluation test.

BRIEF DESCRIPTION OF THE DRAWINGS

The above and other objects, features, and advantages of the Invention will become more apparent from the following description when taken in conjunction with the accompanying drawings.

DESCRIPTION OF THE PREFERRED EMBODIMENTS

FIRST EMBODIMENT

Figure 1:
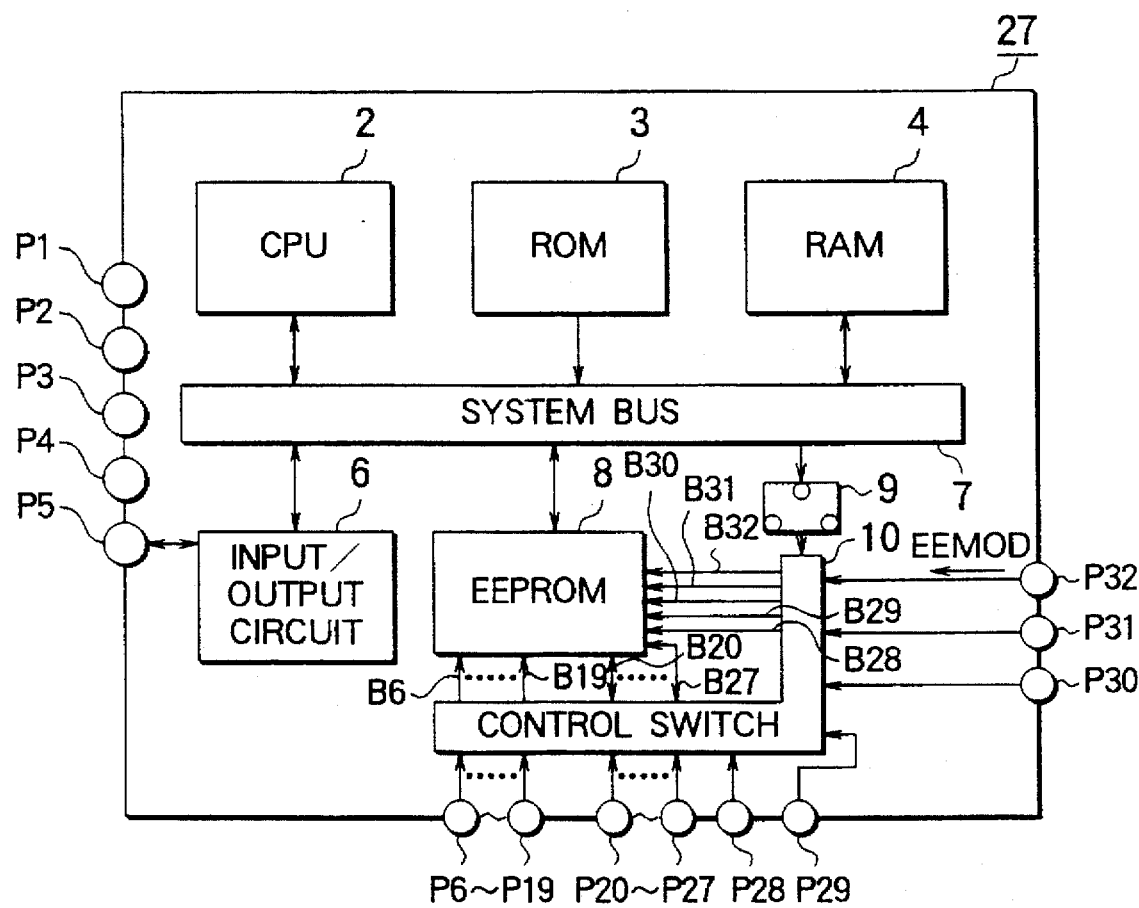
FIG. 1 is a block diagram showing an arrangement of a microcomputer according to a first embodiment of this invention.

FIG. 1 is a block diagram showing an arrangement of a microcomputer 27 according to an embodiment of the present invention. As shown in FIG. 1, the microcomputer 27 of this invention is provided with an EEPROM 8 allowing data to be written and read through direct external control, not through a CPU 2 acting as central processing means, and a control register 9 for controlling direct external control of the EEPROM 8, these being electrically coupled to a system bus 7. In addition, a control switch 10 is electrically connected to the control register 9 so as to select one of allowance and inhibition of the input of external input signals to the EEPROM 8 through setting of the control register 9 which is controlled by the CPU 2. To the control switch 10 there are connected dedicated terminals P6 to P32 accepting the external input signals for the direct external control of the EEPROM 8. Of the dedicated terminals P6 to P32, the terminals P6 to P19 are address bus terminals (AD0 to AD13), the terminals P20 to P27 are data bus terminals (DB0 to DB7), the terminals P28 to P32 are control signal terminals for separate or independent operation, i.e., a VDD terminal, GND terminal, CLK (clock) terminal, R/W (reading/writing) signal input terminal, and EEMOD terminal receiving a signal for compulsory switching to the separate operation mode of direct external control. The other arrangements are the same as those in the known example shown in FIG. 10 and the description thereof will be omitted for brevity.

In this embodiment, an input and output circuit 6 and input and output terminals P1 to P5 serve as first input and output means whereby the writing and reading to and from the EEPROM 8 are carried out through the CPU 2. Further, the dedicated terminals P6 to P32 act as second input and output means whereby the direct external control for separate operation of the EEPROM 8 is implemented without using the CPU 2. Still further, the control register 9 and the control switch 10 constitute first external input and output control means to make the switching between the allowance and inhibition of direct external input and output through the second input and output means.

A description will first be given of writing and reading of data in and from the EEPROM 8 under direct external control. In response to the turning-on of a power supply applied to the microcomputer 27, the CPU 2 sets the EEPROM 8 to a state allowing direct external control of the EEPROM 8. After setting to the allowed state, a voltage is applied to the VDD terminal P28 and the GND terminal P29 functioning as the external input terminals for the direct external control of the EEPROM 8 and a signal with "L" level is given to the EEMOD terminal P32, whereby the EEPROM 8 can enter into the direct external control mode. The EEMOD signal inputted to the EEMOD terminal P32 is led through the control switch 10 to the EEPROM 8.

Figure 2:
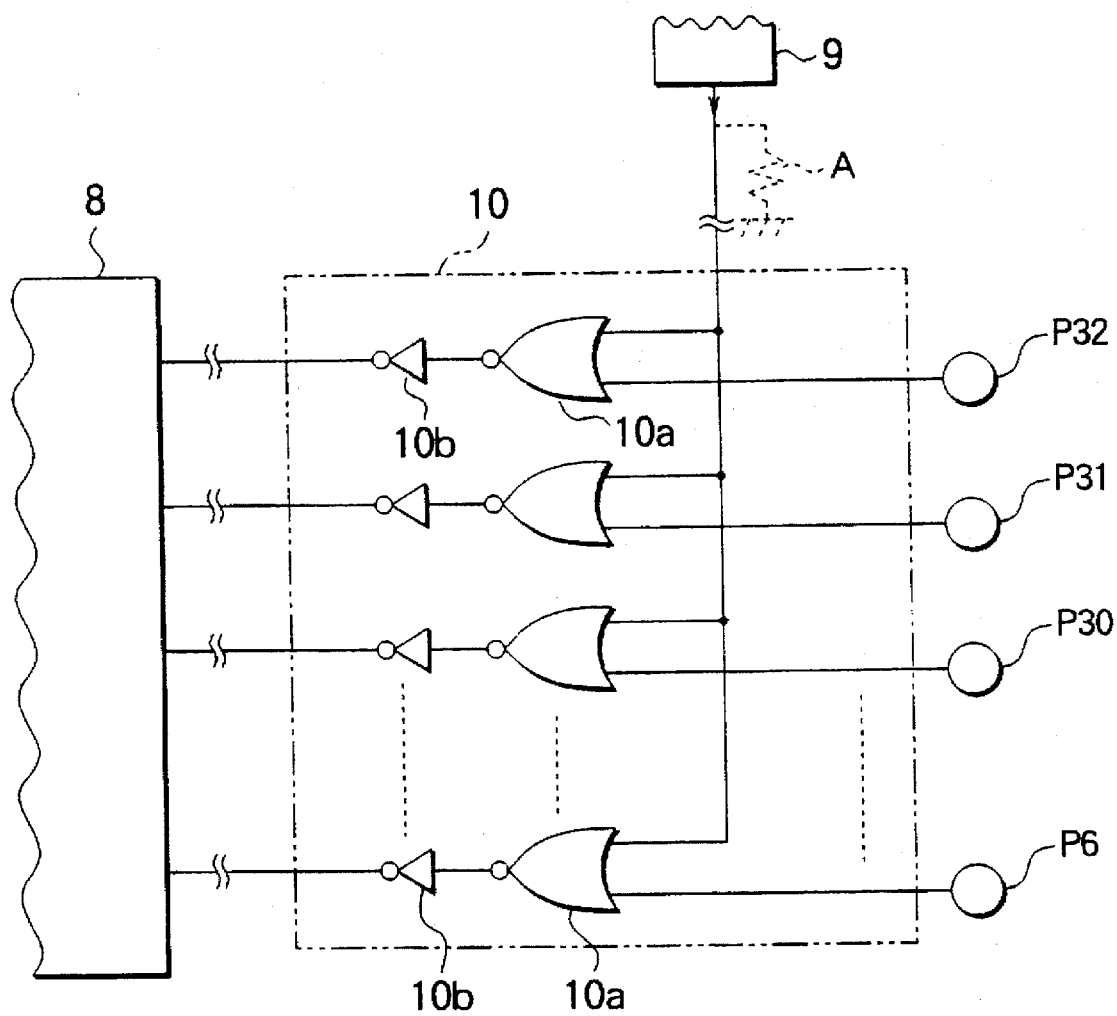
FIG. 2 is a block diagram showing an arrangement of a control switch in the first embodiment.

FIG. 2 illustrates one example of a circuit of the control switch 10. As shown in FIG. 2, the switch circuit 10 is made up of a plurality of NOR gates 10a and a plurality of inverters 10b electrically connected to the plurality of NOR gates 10a, respectively. Since the output of the control register 9 is coupled to one of the input terminals of the NOR gates 10a, when the output of the control register 9 takes the "H" level, the outputs of the NOR gates 10a are fixed so that the inputs from the external terminals P6 to P32 are not input into the EEPROM 8. On the other hand, when the output of the control register 9 has the "L" level, the inputs of the external terminals P6 to P32 are input to the EEPROM 8.

Figure 3:
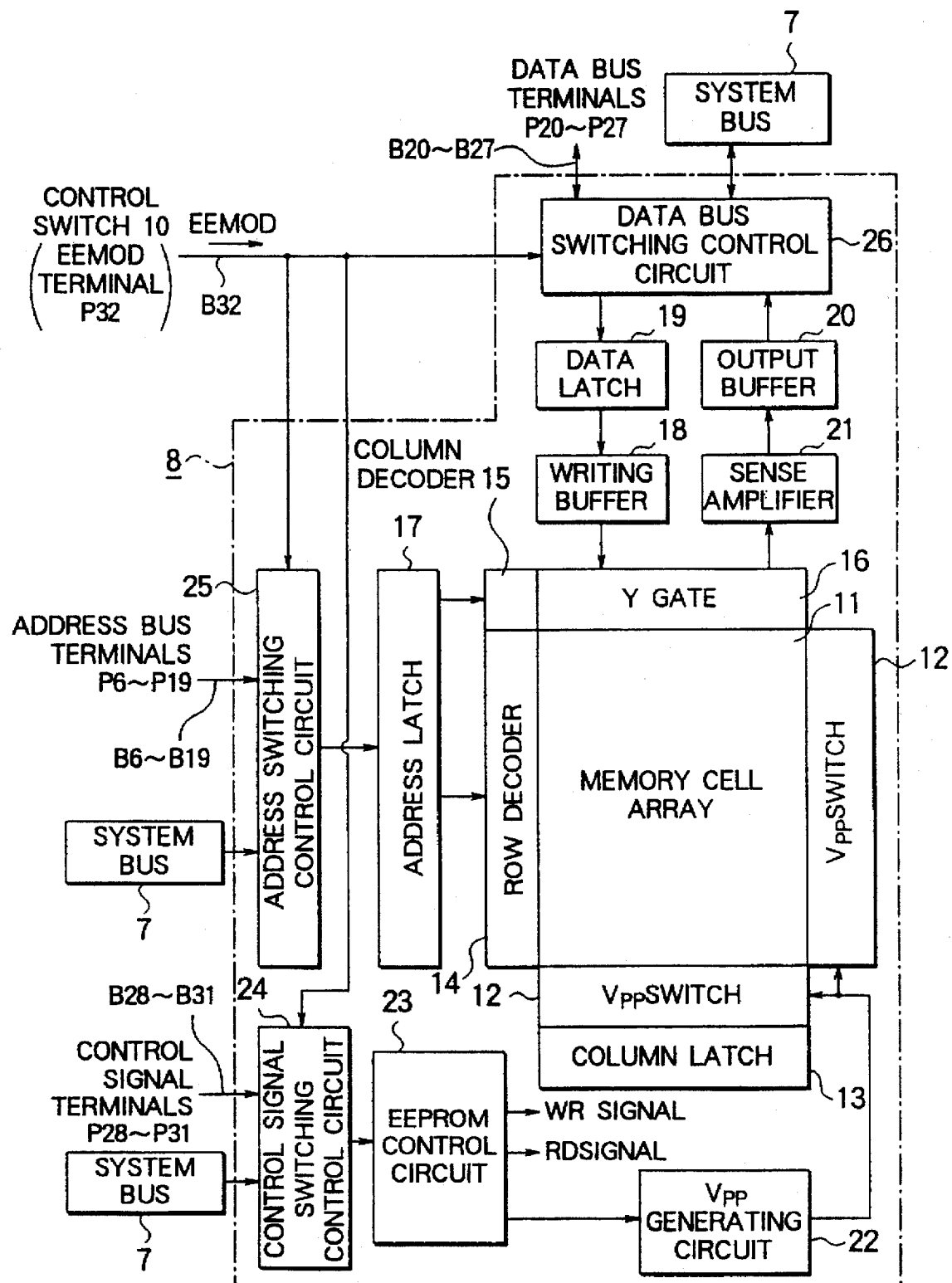
FIG. 3 is a block diagram showing an arrangement of an EEPROM in the first embodiment.

Secondly, a description is given with reference to FIG. 3 in terms of the EEPROM 8. The external signals are input into the EEPROM 8 through the control switch 10 from the address bus terminals P6 to P19, the data bus terminals P20 to P27, the control signal terminals P28 to P31 and the EEMOD terminal P32. As has been shown in FIG. 1, a plurality of buses B6 to B32 are disposed between the control switch 10 and the EEPROM 8. Thus, the signals input into the address bus terminals P6 to P19 are transmitted through the address buses B6 to B19 from the control switch 10 to the EEPROM 8, respectively. Similarly, the signals input into the data bus terminals P20 to P27 are respectively transmitted through the data buses B20 to B27, and the the signals inputted into the data bus terminals P28 to P31 are respectively transmitted through the control signal buses B28 to B31, and further, the EEMOD signal inputted into the EEMOD terminal P32 are transmitted through the EEMOD bus B32. As shown in FIG. 3, in the EEPROM 8, there are provided three switching control circuits serving as signal switching control means, i.e., an address switching control circuit 25, data bus switching control circuit 26, and control signal switching control circuit 24, which carry out switching between the external signals input through the terminals P6 to P31 to the EEPROM 8 and the signals to the EEPROM 8 from the system bus 7 of the microcomputer 27, in accordance with the EEMOD signal, externally through the EEMOD terminal P32. Although in this embodiment the three switching control circuits 24 to 26 are incorporated into the EEPROM 8 as illustrated, this invention is not limited to this arrangement but, for example, alternatively permits the switching circuits to be separate from the EEPROM. In addition, the FIG. 2 control switch 10 may be provided in the three switching control circuits 24 to 26, if required.

Furthermore, the EEPROM 8 includes a memory cell array 11 for storing data, and a column decoder 15 and row decoder 14 for selecting a memory cell of the memory cell array 11. There is also provided an address latch 17 for latching the address selected by the address switching control circuit 25. The address latch 17 is coupled to the column decoder 15 and further to the row decoder 14. In addition, to the control signal switching control circuit 24, there is electrically connected an EEPROM control circuit 23 for controlling the entire EEPROM 8. There is also provided a VPP generating circuit 22 for generating a high voltage VPP, whereby the high voltage VPP is applied to a VPP switch 12 under control of the EEPROM control circuit 23. Further, a column latch 13 is included for temporarily latching written data. Moreover, a Y gate 16 is provided to the memory cell array 11 and is electrically coupled to the data bus switching control circuit 26 through a writing buffer 18 and a data latch 19 which are used for writing and further through a sense amplifier 21 and an output buffer 20 which are used for reading.

The operation is as follows. That is, the entire EEPROM 8 is under control of the EEPROM control circuit 23 as described above, and a control signal selected by the control signal switching control circuit 24 is input into the EEPROM control circuit 23 so that signals are supplied to the respective functional blocks of the EEPROM 8. For the writing and reading operations in and from the EEPROM 8, in accordance with the state of the externally input EEMOD signal input to the EEMOD terminal 23, the address selected by the address switching control circuit 25 is latched in the address latch 17 so that the column decoder 15 and row decoder 14 select a memory cell of the memory cell array 11 in accordance with the latched address data. When data is written, a WR signal (writing signal) is delivered from the EEPROM control circuit 23 to the respective functional blocks. A data signal selected by the data bus switching control circuit 26 is latched in the data latch 19 before being stored in the writing buffer 18 and then supplied to the Y gate 16 and latched in the column latch 13. Thereafter, the high voltage VPP boosted in the VPP generating circuit 22 under control of the control circuit 23 is applied to the VPP switch 12 for carrying out the writing operation. When the data is read out, the data stored in the memory cell of the memory cell array 11 selected by the row decoder 14 and column decoder 15 passes through the Y gate 16 and sense amplifier 21 and then is latched in the output buffer 20 at the output timing of an RD signal (reading signal) of the EEPROM control circuit 23, the data being selectively output to the external data bus terminals P20 to P27 or the system bus 7 under control of the data bus switching control circuit 26.

Figure 4:
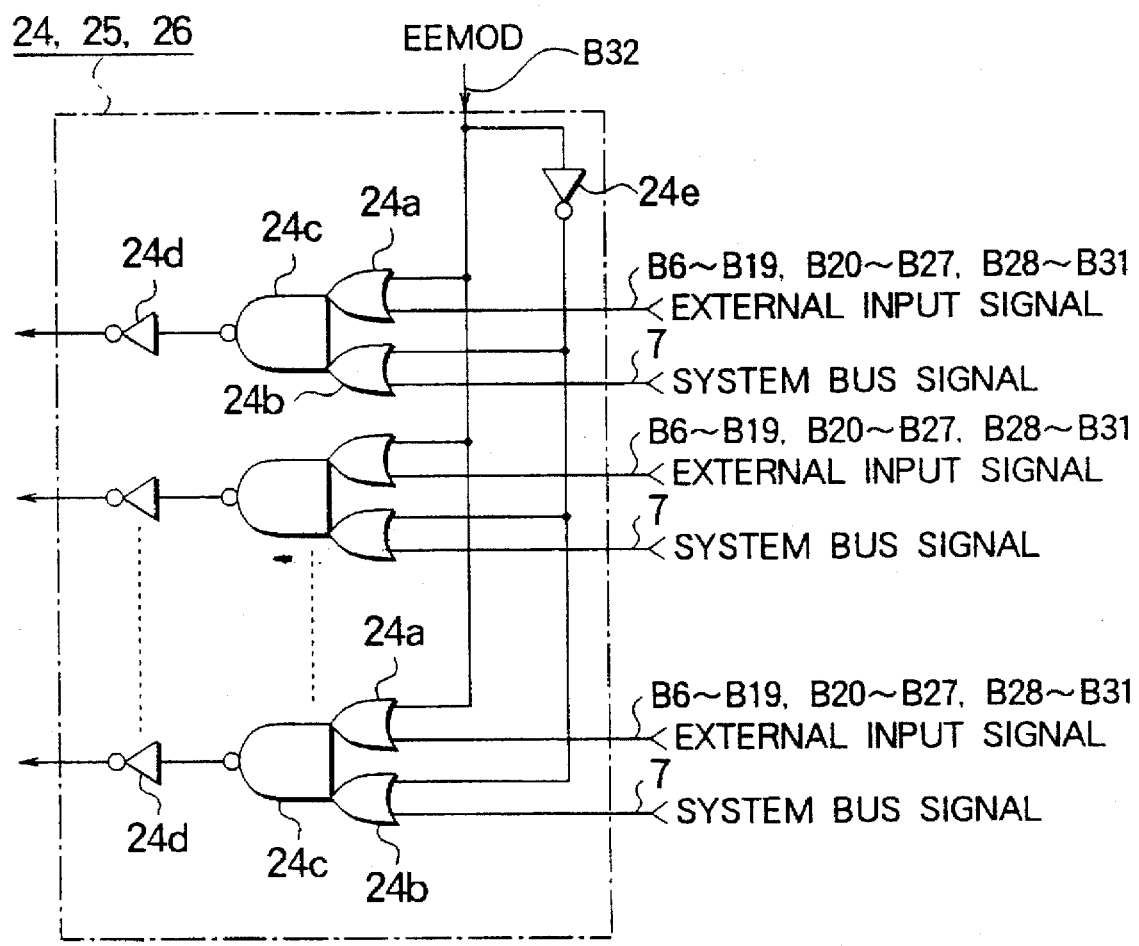
FIG. 4 is a block diagram showing arrangements of a control signal switching circuit, address switching circuit and data bus switching control circuit in FIG. 3.

The switching control circuits 24, 25, and 26 can have the same arrangement, and FIG. 4 illustrates one example thereof. As shown in FIG. 4, each of the switching control circuits 24, 25 and 26 includes composite gates, each of which includes a NAND gate 24c and OR gates 24a, 24b, and inverters 24d, 24e. Each of the NAND gates 24c is electrically connected to two OR gates 24a, 24b so as to selectively take one of an external input signal input through the dedicated terminals P6 to P19, P20 to P27 and P28 to P31 and transmitted through the control switch 10, and a signal delivered from the system bus 7. The output of the EEMOD terminal P32 transmitted through the control switch 10 is connected to one input terminal of the OR gate 24a coupled to the NAND gate 24c, and the output of the dedicated terminals P6 to P19, P20 to P27 or P28 to P31 is connected to the other input terminal of the same OR gate 24a. In addition, the output of the EEMOD terminal P32 is inverted by the inverter 24e, the inverted signal being connected to one input terminal of the OR gate 24b coupled to the NAND gate 24c, while the signal from the system bus 7 is connected to the other input terminal of the same OR gate 24b. When the signal input into the EEMOD terminal P32 takes the "H" level, the signal from the system bus 7 is output, while when the signal input into the EEMOD terminal P32 is in the "L" level, the external input signal is output.

As a result of the above, the EEPROM 8 is directly controlled externally for reading and writing. Subsequently, a description is given in terms of inhibiting direct external control. For inhibiting direct external control, the control register 9 is set to the inhibiting state under control of the CPU 2 whereby the output of the control register 9 turns the "H" level, with the result that the outputs of the NOR gates 10a of the control switch 10 shown in FIG. 2 are fixed so as not to accept the inputs from the dedicated terminals P6 to P31 at all, thus inhibiting the direct writing/reading in and from the EEPROM 8.

Although in the first embodiment the CPU 2 sets the control register 9 after the turning-on of a power supply to the microcomputer 27, it is also appropriate that a pull-down resistor A or the like as indicated by a dotted line in FIG. 2 is included as an initial setting means for the control register 9 so that, at the time of the turning-on of the power supply, the control register 9 is automatically set to a state to allow direct external control. In this case, even if the CPU 2 and other elements do not operate, only the EEPROM 8 can be directly externally controlled so as to be separately operable. Further, taking into account the security of the data after the microcomputer is put on the market, the pull-down resistor A may be burned off after testing and writing of the initial data prior to being put on the market. Moreover, it is also possible that, as the initial setting means, the control register 9 is set during manufacturing so that the initial value of the output of the control register 9 is in the "L" level.

Figure 10:
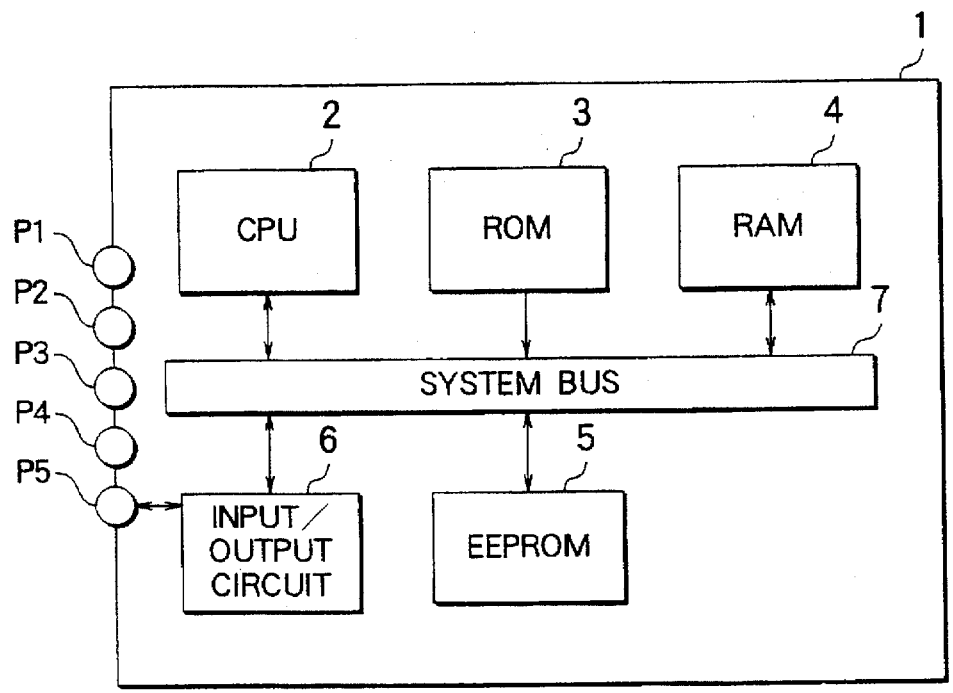
FIG. 10 is a block diagram illustrating one example of an arrangement of a privately known EEPROM built-in microcomputer.
Figure 11:
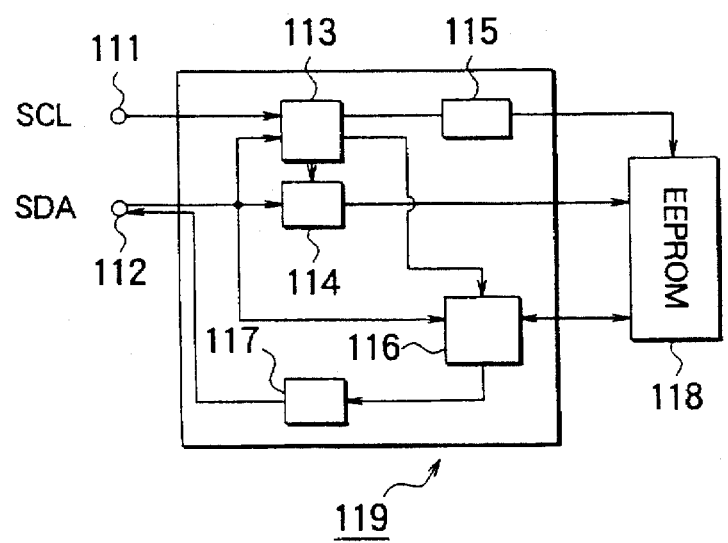
FIG. 11 is a block diagram illustrating another example of an arrangement of a conventional EEPROM built-in microcomputer.

As described above, in the microcomputer with the built-in EEPROM according to this embodiment, even if the peripheral functions of the EEPROM 8 do not surely operate in the test process before being put on the market, the writing and reading of data in and from the EEPROM 8 can be done directly and in parallel through the dedicated terminals P6 to P31 with externally applied signals without using the CPU 2, which allows speedy testing such as continuous writing which has so far required a huge amount of time in the known EEPROM 5 as shown in FIG. 10. In addition, since the control register 9 makes a selection between allowance and inhibition of external control or controlled by the CPU 2, if direct external control of the EEPROM 8 is inhibited when microcomputer is put on the market, so there is difficulty in readily rewriting and reading out data in the EEPROM 8, thus ensuring the security of the data.

SECOND EMBODIMENT

Figure 5:
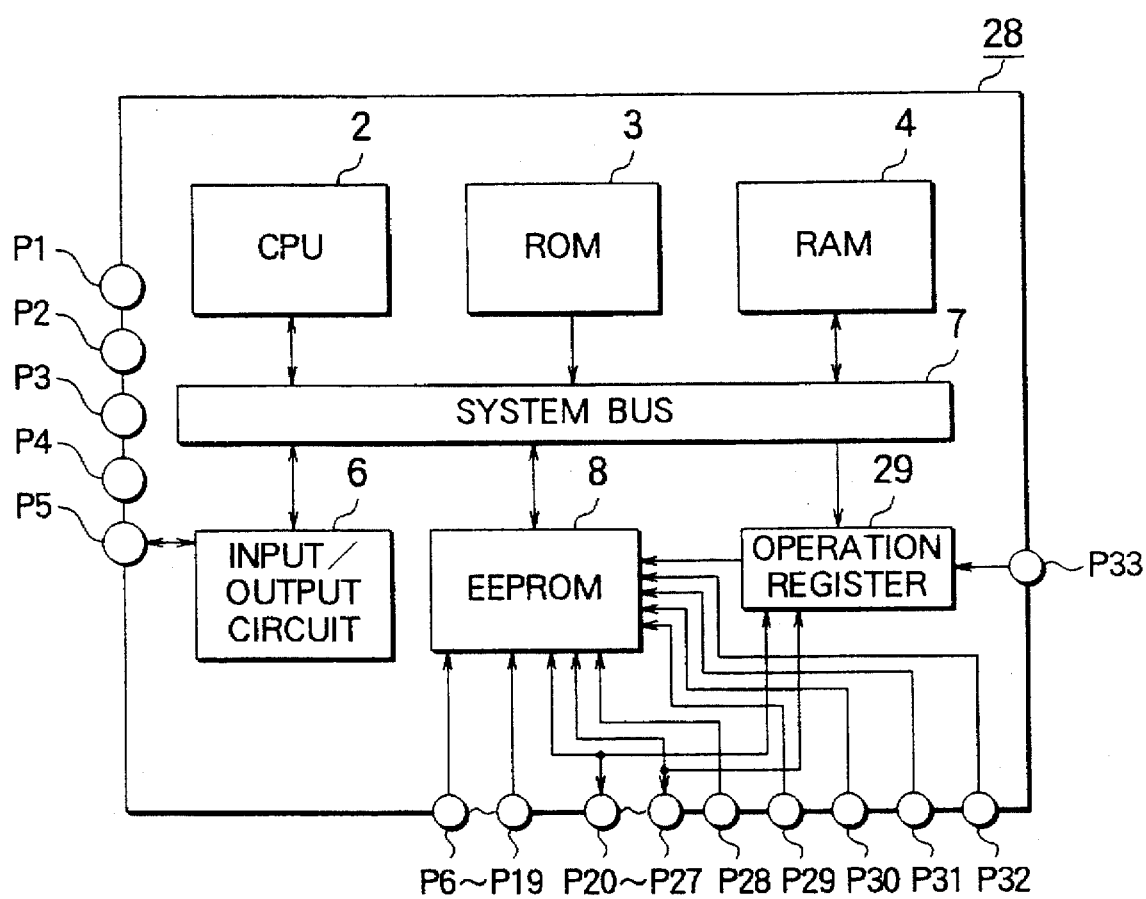
FIG. 5 is a block diagram illustrating an arrangement of a microcomputer according to a second embodiment of this invention.

A description of a microcomputer according to another embodiment of this invention is given with reference to FIG. 5. In this embodiment there are provided an EEPROM 8 allowing data to be rewritable and readable under external control, an operation register 29 in which data for changing the operation of the EEPROM 8 into a variety of modes is written and which is externally controllable, and a writing signal input terminal P33 for receiving a writing signal for writing of data in the operation register 29. The operation register 29 can be separate, as illustrated, or may be incorporated in an auxiliary area within a RAM 4, or in the EEPROM 8.

Secondly, a description is given of the operation. Data bus terminals P20 to P27 of the microcomputer 28 are coupled to both of the EEPROM 8 and the operation register 29 so that data can be input and output to and from both. First, a description is given of setting a given value in the operation register 29 before writing data in the EEPROM 8. Signals are input to a VDD terminal P28, GND terminal P29, and EEMOD terminal P32, respectively, so that the EEPROM 8 is set to a state in which direct external control is possible. Subsequently, data set in the operation register 29 is input to data bus terminals P20 to P27 and a writing signal is to the writing signal input terminal P33, whereby the data is set in the operation register 29. Then, the address of a memory cell of a memory cell array 11 (see FIG. 3) for writing is applied to external address bus terminals P6 to P19, before data to be written is applied to the data bus terminals P20 to P27 and then the writing signal is input in an R/W terminal P31, thereby writing the data in the EEPROM 8. At this time, a control signal is input from the operation register 29 to the EEPROM 8 whereby the writing is carried out in the writing mode depending upon the value set in the operation register 29.

Secondly, a description is given of reading out the data. First, signals are respectively input to a VDD terminal P28, GND terminal P29 and EEMOD terminal P32 and the EEPROM 8 is set to a state where direct external control is possible, before the address of the memory cell of the memory cell array 11 (see FIG. 3) of the EEPROM 8 to be read out is set at external address terminals P6 to P 19. Further a reading signal is input into the R/W terminal P31, with the result that the data to be read out is output to the data bus terminals P20 to P27.

As described above, according to this embodiment, there are provided the EEPROM 8 allowing data to be writable and readable in parallel by direct external control, and the operation register 29 directly externally controllable, whereby the contents of the operation register 29 can freely be set externally and the writing and reading in and from the EEPROM 8 according to the contents (operation mode) set in the operation register 29 can be accomplished in parallel under the direct external control. This means that the test of the EEPROM 8 can singly and quickly be made for statisfactory of its contents.

THIRD EMBODIMENT

Figure 6:
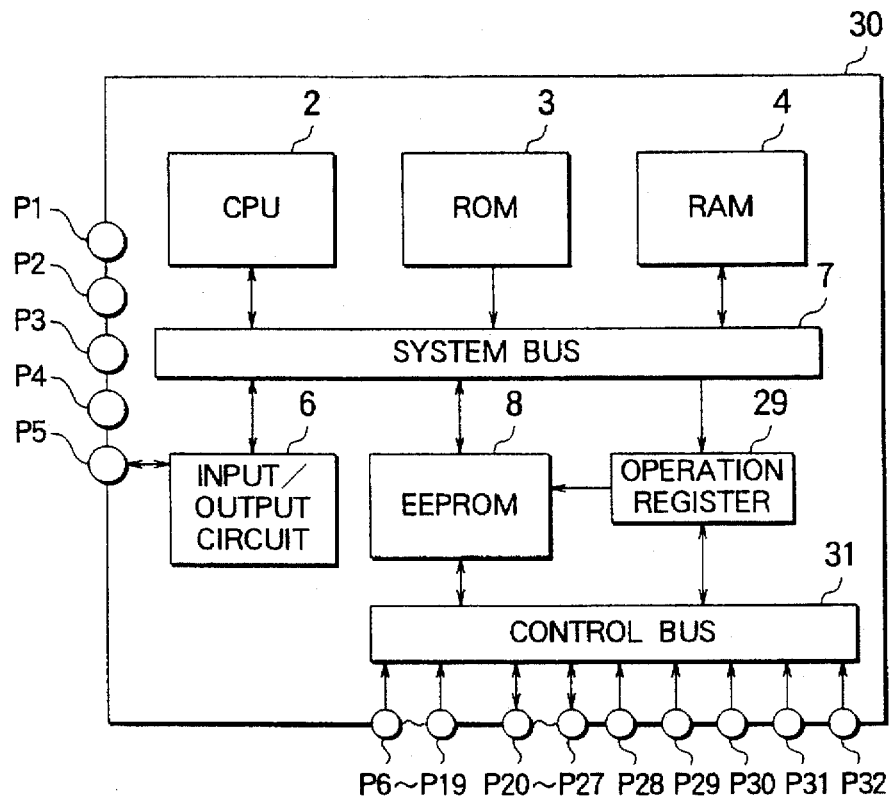
FIG. 6 is a block diagram illustrating an arrangement of a microcomputer according to a third embodiment of this invention.
Figure 7:
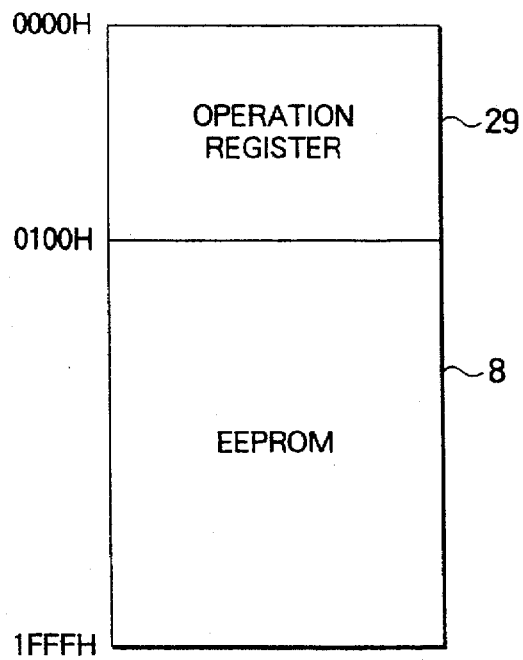
FIG. 7 is an illustration of a memory map of an EEPROM memory and operation register in the third embodiment.

FIG. 6 is a block diagram showing an arrangement of a microcomputer 28 according to a further embodiment of this invention. In this embodiment, the basic arrangement is the same as the embodiment shown in FIG. 5, except that dedicated terminals P6 to P32 receiving external signals, an EEPROM 8 and an operation register 29 are coupled to each other through a control bus 31 as shown in FIG. 6. In this embodiment, as shown in FIG. 7, the memory of the EEPROM 8 and the operation register 29 have a single memory map. Accordingly the operation register 29 and the EEPROM 8 are coupled through the control bus 31 to each other. The control bus 31 and the dedicated terminals P6 to P32 make up second input and output means in this embodiment. Further, since both memory spaces are on the same memory map, addresses are also assigned to the operation register 29 like the EEPROM 8. Accordingly, when data is written in the operation register 29, the address assigned to the operation register 29 is set at the external address terminals P6 to P19 and subsequently the set data is input into data terminals P20 to P27 before an R/W terminal 31 is set to the writing state, thus making it possible to carry out the writing of the data in the operation register 29. In addition, for the writing of data in the EEPROM 8, of the addresses assigned to the EEPROM 8, the address in which the data will be written is set in the address terminals P6 to P19, before the data is input in the data terminals P20 to P27 and the R/W terminal 31 is set to the writing state, thereby completing the writing operation.

Furthermore, for reading out from the operation register 29, of the addresses of the operation register 29, the address from which the content will be read out is set in the address terminals P6 to P19 before the R/W terminal P31 is set to the reading state. The content of the operation register 29 is read out at the data terminals P20 to P27. Similarly, for the reading-out of the data from the EEPROM 8, the address of the EEPROM 8 from which the content will be read out is set in the address terminals P6 to P19 before the R/W terminal 31 is set to the reading state, which makes it possible to read out the content of the operation register 29 at the data terminals P20 to P27.

According to this embodiment, the EEPROM 8 and the operation register 29 of the EEPROM 8 are made to be externally controllable. A further feature of this embodiment is that the operation register 29 and the EEPROM 8 are placed on the same memory map, which can offer the same effect as the foregoing second embodiment. In addition, with the address of the operation register 29 being set through the address terminals or with the address of the EEPROM 8 being set through the address terminals, the data is easily writable and readable and separate or independent evaluation of the EEPROM 8 is readily and effectively done.

FOURTH EMBODIMENT

Figure 8:
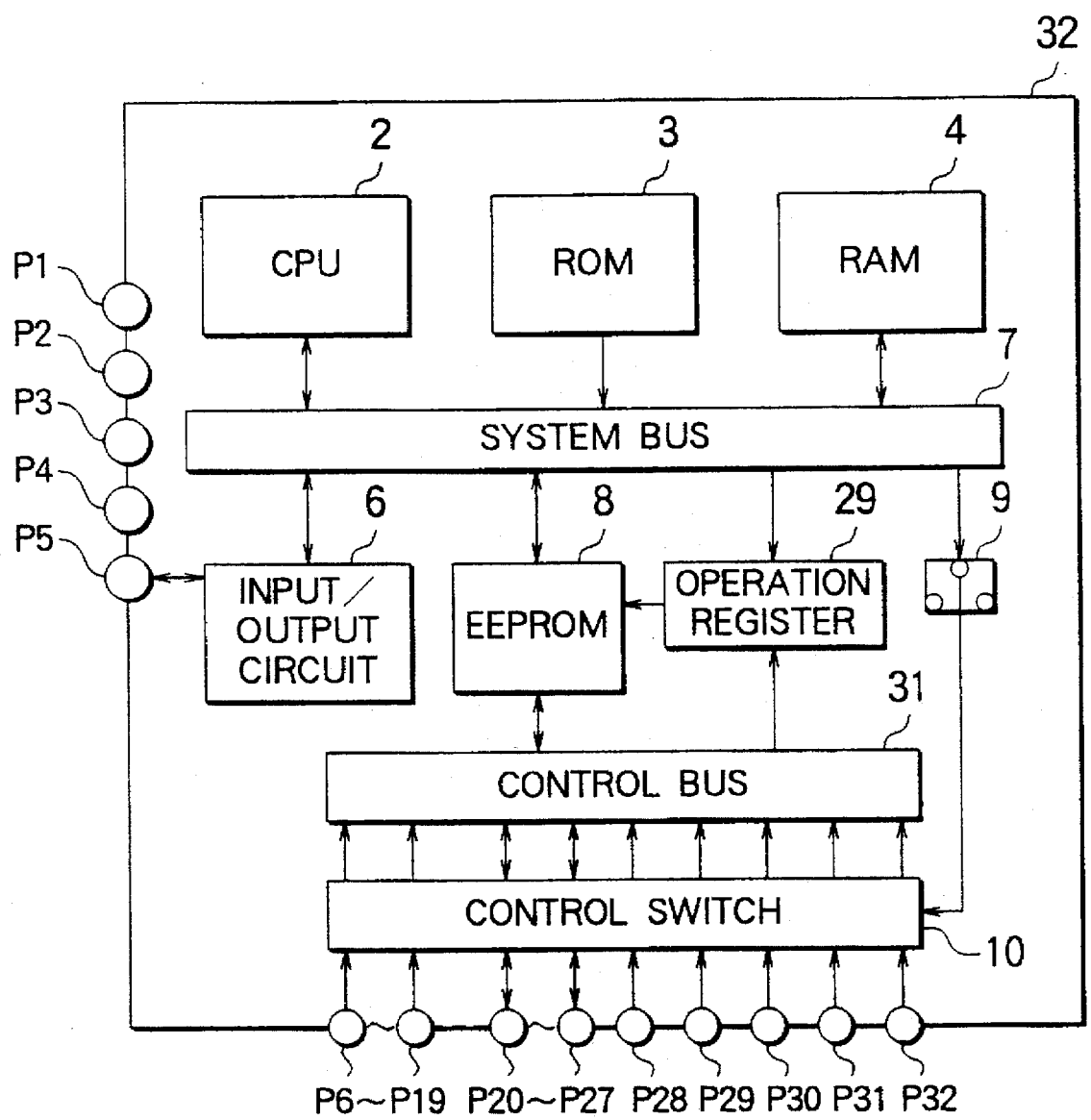
FIG. 8 is a block diagram illustrating an arrangement of a microcomputer according to a fourth embodiment of this invention.

FIG. 8 is a block diagram showing an arrangement of a microcomputer according to a still further embodiment of this invention. This embodiment provides an EEPROM built-in microcomputer having a combination of the functions of the aforementioned first and third embodiments. That is, the control register 9 and control switch 10 for separately operating the EEPROM 8 in the first embodiment are added to the arrangement of the third embodiment. As illustrated, the control register 9 is electrically coupled through the system bus 7 to the CPU 2. When under the control of the CPU 2 the control register 9 is set to the state where the external operation is possible. The control switch 10 inputs the signals which are received from the dedicated terminals P6 to P32 into the control bus 31, thereby making possible the direct writing and reading of the EEPROM 8 and the operation register 29 through the dedicated terminals P6 to P32. On the other hand, when under the control of the CPU 2 the control register 9 is in the state where the direct external control is inhibited, the control switch 10 does not accept the input from the dedicated terminals P6 to P32, thereby not allowing the signal to be transferred to the control bus 31. The writing and reading of the data in and from the EEPROM 8 and the operation register 29 are carried out according to the procedure described for the third embodiment. The control switch 10 serves as second input and output control means for switching between allowance and inhibition of external input and output by the second input and output means under control of CPU 2.

Although the setting of the control register 9 is changed by the CPU 2 in this embodiment, if the output of the control register 9 is coupled to the pull-down resistor A (see FIG. 2), the output of the control register 9 is automatically fixed at the time of turning-on of the power supply whereby the direct external control of the EEPROM 8 and the operation register 29 through the dedicated terminals P6 to P32 becomes possible even if the CPU 2 does not operate.

Moreover, although in this embodiment the control switch 10 is connected to the dedicated terminals P6 to P32 and the control bus 31 is connected to the control switch 10, it is also possible that the dedicated terminals P6 to P32 are connected to the control bus 31 before being connected to the control switch 10. This case also creates the same effect.

As described above, in this embodiment, the operation register 29 of the EEPROM 8 is designed to be externally controllable, and the operation register 29 and the EEPROM 8 are placed on the same memory map. The control register 9 is provided for external control of the allowance or inhibition of the direct control of the EEPROM 8, which makes it possible to separately and effectively evaluate the EEPROM 8 without depending on the CPU 2, as well as to gain the security of the data with the separate operation of the EEPROM being inhibited before the microcomputer 32 is put on the market.

FIFTH EMBODIMENT

Figure 9:
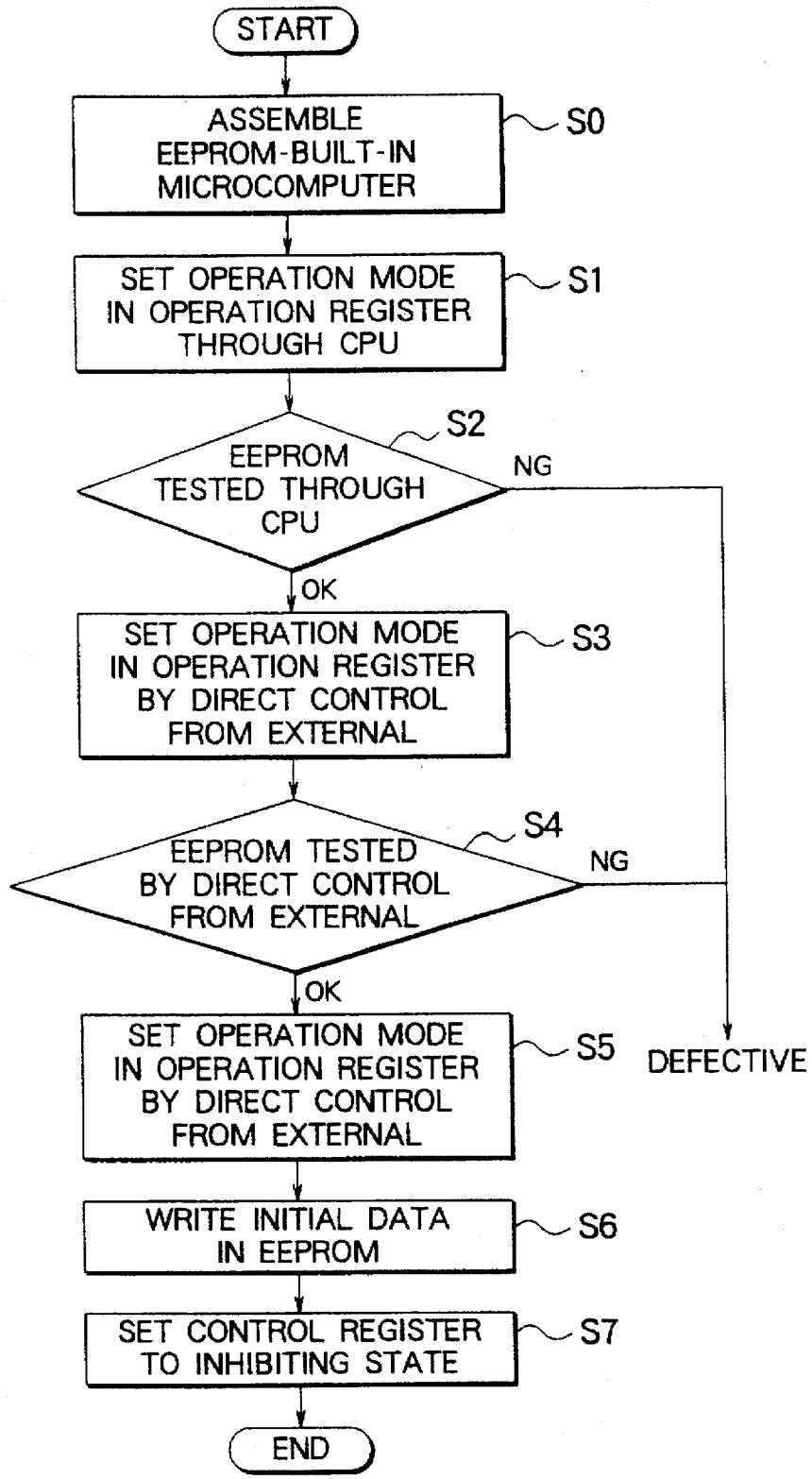
FIG. 9 is a flow chart showing a manufacturing method of a microcomputer according to the fourth embodiment.

FIG. 9 is a flow chart showing a method of manufacturing the EEPROM 8 of the microcomputer according to the fourth embodiment. First, the EEPROM built-in microcomputer in the fourth embodiment is assembled or fabricated (step S0), then followed by a test step. For the test of the EEPROM 8, the content of the operation register 29, if required, is set through the CPU 2 (step S1), before the writing/reading test of the EEPROM 8 is simply made through the CPU 2 (step S2). At this time, external input and output of the serial data is performed through the I/O terminal P5. A test is made as to whether or not the writing and reading of data in and from the EEPROM 8 is possible under control of the CPU 2, but no test is made, for example, in terms of the continuous writing of data in the EEPROM 8, a large number of times, for example, approximately 10000 times, which requires much time. Subsequently, under control of the CPU 2 the control register 9 is set to the state where direct external control of the EEPROM 8 is allowed. If required, the operation register 29 is directly externally controlled through the dedicated terminals P6 to P31 to switch the operation mode (step S3), before a test such as the continuous writing in the EEPROM 8 which requires much time is made through the dedicated terminals P6 to P31 (step S4). Then, in a microcomputer that is designated as a good product, the operation register 29, if needed, is directly externally controlled through the dedicated terminals P6 to P31 to switch the operation mode (step S5), before the writing of the initial data in the EEPROM 8 is practiced through the dedicated terminals P6 to P31 (step S6). Thereafter, through the CPU 2 the control register 9 is set to the inhibiting state, then terminating the test of the EEPROM 8 (step S7). Thus, direct external writing/reading of data in and from the EEPROM 8 becomes impossible except that releasing of the inhibiting state of the control register 9 is known.

In a method of manufacturing a microcomputer according to the first embodiment, because there is no operation register, the processes corresponding to the steps S1, S3, and S5 in FIG. 9 are unnecessary. Further, in a method of manufacturing a microcomputer according to the second or third embodiment, because there is no control register 9, the process corresponding to the step S7 in FIG. 9 becomes unnecessary.

In the microcomputers according to the first to fourth embodiments, the writing of the initial data and the test of the EEPROM 8 which needs much time are made with the EEPROM 8 being directly externally controlled, whereupon it is possible to shorten the time required for the test of the EEPROM 8 and the time needed for writing of the initial data therein, thus effectively improving productivity. In addition, since in the first to fourth embodiments the control register 9 is set the inhibiting state after the writing of the initial data, the security of the data after the microcomputer is put on the market is obtained. Further, since in the second to fourth embodiments the content of the operation register is directly externally controlled, even if the peripheral equipment other than the EEPROM 8 is not in operation, it is possible to make the test to provide an excellent evaluation content, as well as to freely change the writing mode of the initial data.

According to the first aspect of the present invention, there are provided the second input and output means for directly externally performing writing and reading in and from the memory of the EEPROM and external input and output control means for carrying out the switching between the allowance and inhibition of external input and output by the second input and output means, which makes it possible to quickly conduct processes such as a continuous writing test of the EEPROM memory which has heretofore taken much time.

In addition, according to the second aspect, since the control means switches between the allowance and inhibition of external input and output, if the switching is made beforehand such that the external input and output are inhibited when the microcomputer is put on the market, it is possible to prevent the data from being rewritten and read out. Moreover, the invention also facilitates acceleration and simplification of the manufacturing processes and improves the security of the data.

According to the third aspect, there are provided the second input and output means for direct external writing and reading in and from the memory of the EEPROM, whereby the control of the operation register of the EEPROM is directly made externally through the second input and output means. This allows quickly conducting processes such as a continuous writing test of the EEPROM memory which has heretofore taken much time and freely setting the contents of the operation register externally for the evaluation test of the EEPROM. In addition, it is possible to improve the reliability.

According to the fifth aspect, there are provided the second input and output means for directly performing the writing and reading in and from the memory of the EEPROM from the external and external input and output control means for carrying out the switching between the allowance and inhibition of external input and output to be made by the second input and output means. Moreover, the control of the operation register of the EEPROM is made directly externally through the second input and output means. This permits quickly conducting processes such as continuous writing test into the EEPROM memory which has heretofore taken much time and freely setting the contents of the operation register externally for the evaluation test of the EEPROM. In addition, since the control means switches between the allowance and inhibition of external input and output, if the switching is made beforehand such that the input and output are inhibited when the microcomputer is put on the market, it is possible to prevent the data from being rewritten and read out on the market. Further, the invention also facilitates acceleration and simplification of the manufacturing process and improves the security of the data and the reliability of the product.

According to the fourth and sixth aspects, the EEPROM memory and the operation register are placed on the same memory map, which can easily carry out the writing and reading of data in and from any one of the EEPROM memory and the operation register by merely setting an address of the EEPROM memory or an address of the operation register in the second input and output means.

According to the seventh and eighth aspects, the initial setting means is provided which is designed to set the external input and output control means so that the input and output are possible in the initial state, whereby the microcomputer can be set into a state in which direct external control is automatically allowed at the time of turning-on of a power supply.

According to the ninth aspect, in a method of manufacturing a microcomputer, direct external control of the EEPROM is realized, thus quickly conducting processes such as continuous writing test into the EEPROM memory which has heretofore taken much time.

In addition, according to the eleventh and thirteenth aspects, since the switching is made between the allowance and inhibition of external input and output by the external input and output control means afterwards, if the switching is made beforehand such that the external input and output are inhibited when the microcomputer is put on the market, it is possible to prevent the data from being rewritten and read out on the market. Further, the invention also facilitates acceleration and simplification of the manufacturing process and improves the reliability of the product as well as the security of the data.

According to the twelfth aspects, the externally operation register is provided so that the contents of the operation register may be freely externally changed for the evaluation test of the EEPROM, which makes it possible to enrich the evaluation contents in the evaluation test.

According to the tenth aspect, in a method of manufacturing an EEPROM built-in microcomputer, direct external control of the EEPROM is realized, thus processes such as continuous writing test into the EEPROM memory may be quickly conducted whereas these processes have heretofore taken much time. In addition, the operation register which is externally controllable is provided so that the contents of the operation register is freely changed externally for the evaluation test of the EEPROM, which makes it possible to enrich the evaluation contents in the evaluation test.

According to the fourth and fifteenth aspects, the EEPROM memory and the operation register are placed on the same memory map, which can easily carry out the writing and reading of data in and from any one of the EEPROM memory and the operation register by merely setting an address of the EEPROM memory or an address of the operation register in the second input and output means, thus allowing speedy and effective evaluation test.

It should be understood that the foregoing relates to only preferred embodiments of the invention, and that it is intended to cover all changes and modifications of the embodiments of the invention herein used for the purpose of the disclosure, which do not constitute departures from the spirit and scope of the invention.

What is claimed is:

1. A microcomputer comprising:

a central processing unit;

an EEPROM including a non-volatile memory in which data can be electrically stored and from which stored data can be read;

first input/output means coupled to said central processing unit for inputting a signal into said microcomputer and outputting a signal from said microcomputer under control of said central processing unit;

second input/output means electrically connected to said EEPROM for storing data in said EEPROM and for reading stored data from said EEPROM in response to an external signal applied directly from an external device to said microcomputer;

signal switching control means electrically connected between said EEPROM and said first and second input/output means for selectively connecting said EEPROM to said first input/output means and to said second input/output means; and external input/output control means electrically connecting said second input/output means to said EEPROM for selectively inhibiting direct external input to and output from said EEPROM through said second input/output means under control of said central processing unit, said external input/output control means including a control register coupled to said central processing unit for controlling operation of said EEPROM under control of said central processing unit, and a control switch including a plurality of logic gates connected between said second input/output means and said signal switching control means and to said control register, said control register selectively generating an inhibition signal for inhibiting said logic gates when said EEPROM is under control of said central processing unit and not generating the inhibition signal when said EEPROM is under direct external control.

2. The microcomputer as claimed in claim 1 comprising initial setting means for, when electrical power is newly applied to said microcomputer, automatically setting said external input/output control means to a first state in which direct external input to and output from said EEPROM are enabled.

3. A microcomputer comprising:

a central processing unit;

an EEPROM including a non-volatile memory in which data can be electrically stored and from which stored data can be read;

first input/output means coupled to said central processing unit for inputting a signal into said microcomputer and outputting a signal from said microcomputer under control of said central processing unit;

second input/output means electrically connected to said EEPROM for storing data in said EEPROM and for reading stored data from said EEPROM in response to an external signal applied directly from an external device to said microcomputer;

signal switching control means having a plurality of logic gates and electrically connected between said EEPROM and said first and second input/output means for selectively connecting said EEPROM to said first input/output means and to said second input/output means; and an operation register electrically connected to said central processing unit and to said second input/output means so that an operational mode of said EEPROM may be set through each of said central processing unit and said second input/output means.

4. The microcomputer as claimed in claim 3 wherein said EEPROM and said operation register have a common memory map.

5. The microcomputer as claimed in claim 3 comprising external input/output control means electrically connecting said signal switching circuit means to said second input/output means and said operation register to said second input/output means for inhibiting direct external input to and output from said EEPROM through said second input/output means under control of said central process unit.

6. The microcomputer as claimed in claim 5 wherein said EEPROM and said operation register have a common memory map.

7. The microcomputer as claimed in claim 5 comprising initial setting means for, when electrical power is newly applied to said microcomputer, automatically setting said external input/output control means to a first state in which direct external input to and output from said EEPROM are enabled.

8. A method of manufacturing a microcomputer comprising:

producing a microcomputer having a central processing unit, an EEPROM including a non-volatile memory in which data may be electrically stored and from which stored data can be read, first input/output means electrically connected to said central processing unit for inputting a signal into said microcomputer and outputting a signal from said microcomputer under control of said central processing unit, second input/output means electrically connected to the EEPROM for storing data in said EEPROM and for reading stored data from the EEPROM in response to an external signal directly applied to said microprocessor, and external input/output control means electrically connecting said second input/output means to said EEPROM for selectively inhibiting direct external input to and output from said EEPROM through said second input/output means under control of said central processing unit; and, said external input/output control means including an operation register electrically connected to said central processing unit for controlling operating of said EEPROM under control of said central processing unit, and a plurality of logic gates connected to said operation register, said operation register selectively generating an inhibition signal for inhibiting said logic gates when said EEPROM is under control of said central processing unit and not generating the inhibition signal when said EEPROM is under direct external control;

testing storing of data in and reading stored data from said EEPROM through said first input/output means under control of said central processing unit;

testing storing of data in and reading of stored data from said EEPROM under direct external control through said second input/output means; and storing initial data in said EEPROM.

9. The method of manufacturing a microcomputer as claimed in claim 8 wherein said EEPROM and said operation register have a common memory map.

* * * * *